(12) United States Patent
Casper et al.

(10) Patent No.: US 6,798,293 B2
(45) Date of Patent: Sep. 28, 2004

(54) DIGITALLY CONTROLLED VARIABLE OFFSET AMPLIFIER

(75) Inventors: Bryan K. Casper, Hillsboro, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/631,626

(22) Filed: Jul. 30, 2003

(65) Prior Publication Data

US 2004/0021519 A1 Feb. 5, 2004

Related U.S. Application Data

(63) Continuation of application No. 10/328,587, filed on Dec. 23, 2002, now Pat. No. 6,617,926, which is a continuation-in-part of application No. 10/037,751, filed on Jan. 2, 2002, now Pat. No. 6,608,582, which is a continuation-in-part of application No. 09/895,625, filed on Jun. 29, 2001, now Pat. No. 6,420,932.

(51) Int. Cl.[7] .................................................. H03F 3/45
(52) U.S. Cl. ....................................... 330/258; 330/253
(58) Field of Search ................................ 330/252, 253, 330/254, 258, 259, 261; 327/359

(56) References Cited

U.S. PATENT DOCUMENTS

| | | | |
|---|---|---|---|
| 4,399,426 A | 8/1983 | Tan | |
| 4,754,169 A | 6/1988 | Morris | |
| 4,829,302 A | 5/1989 | Oitzl et al. | |
| 4,940,983 A | 7/1990 | Phillips et al. | |
| 4,983,969 A | 1/1991 | Iwamoto et al. | |
| 4,987,327 A | 1/1991 | Fernandez et al. | |
| 5,006,727 A | 4/1991 | Ragosch et al. | |
| 5,043,599 A | 8/1991 | Zitta | |
| 5,471,208 A | 11/1995 | Sauer | |
| 5,512,848 A | 4/1996 | Yaklin | |
| 5,517,134 A | 5/1996 | Yaklin | |
| 5,563,598 A | 10/1996 | Hickling | |
| 5,619,169 A * | 4/1997 | Matsuura | 330/254 |
| 5,684,487 A | 11/1997 | Timko | |
| 5,768,700 A | 6/1998 | Kardontchik | |
| 5,854,562 A | 12/1998 | Toyoshima et al. | |
| 6,008,670 A | 12/1999 | Pace et al. | |
| 6,163,215 A * | 12/2000 | Shibata et al. | 330/254 |
| 6,181,268 B1 | 1/2001 | Miyake et al. | |
| 6,201,443 B1 * | 3/2001 | Tanji | 330/254 |
| 6,329,938 B1 | 12/2001 | Spaur et al. | |
| 6,348,882 B1 | 2/2002 | Ciccone et al. | |
| 6,388,521 B1 | 5/2002 | Henry | |
| 6,420,932 B1 | 7/2002 | Casper | |
| 6,552,612 B1 | 4/2003 | Wilson | |

* cited by examiner

Primary Examiner—Henry Choe
(74) Attorney, Agent, or Firm—Blakely, Sokoloff, Taylor & Zafman LLP

(57) ABSTRACT

First and second differential transistor pairs, where each may be intentionally unbalanced or balanced, are provided. First and second digitally variable current generators are coupled to control respective tail currents of the first and second differential pairs. A switch circuit may be coupled to equalize the voltages of the respective tail current nodes. A common mode feedback circuit is also described, to improve common mode rejection of the overall amplifier. Applications of the amplifier circuit include sense amplifiers and comparators.

12 Claims, 10 Drawing Sheets

SHORT THE COMPARATOR INPUTS TO EACH OTHER AND, IF NECESSARY, TO SOME REASONABLE VOLTAGE
660

SWEEP THE OFFSET ADJUSTMENT FROM MAXIMUM NEGATIVE OFFSET TO MAXIMUM POSITIVE OFFSET
664

THE OFFSET OF THE COMPARATOR HAS BEEN TRIMMED TO 1 LSB WHEN THE COMPARATOR OUTPUT CHANGES FROM LOW TO HIGH
668

FIG. 6B

DIGITALLY CONTROLLED VARIABLE OFFSET AMPLIFIER

This is a continuation of application Ser. No. 10/328,587, filed Dec. 23, 2002 now U.S. Pat No. 6,617,926, which is a continuation-in-part of Ser. No. 10/037,751 filed Jan. 2, 2002 now U.S. Pat. No. 6,608,582 which is a continuation-in-part of Ser. No. 09/895,625 filed Jun. 29, 2001 now U.S. Pat. No. 6,420,932.

BACKGROUND

The invention is in general related to amplifier circuits and in particular to those having variable offset capability.

Amplifier circuits are used to amplify an input electrical signal to provide current and/or voltage gains or reductions. They may be used to amplify a single ended or a differential signal. A basic component of many amplifier circuits is the differential transistor pair used as the input stage of the amplifier. When the differential pair is used in conjunction with an output regenerative latch stage, a digital output signal (having one of two stable states) can be obtained that is an indication of a comparison between two single ended input signals or a determination of the magnitude of a differential signal. Due to the high gain and bistable nature of the latch stage, the output nodes of the latch stage are kept equalized until the correct information represented by the input signal can be expected to be present.

Most practical implementations of amplifier circuits suffer from manufacturing process-induced variations in the structure of the circuit elements, which cause an offset in the amplifier's operation. This offset may be explained by, for instance, considering an amplifier that is designed to amplify a differential input signal. In the ideal case, the output of the amplifier would be zero volts if the input differential signal was zero volts. However, in practice, a zero voltage differential input signal often yields a small but nevertheless non-negligible output offset voltage.

Output offset may be corrected using a wide range of techniques known as offset cancellation techniques. In one such technique, the value of the input differential signal that actually yields a zero output voltage is measured and stored, and then is subsequently subtracted from each new input signal to thus cancel the offset of the amplifier.

To help reduce the inherent offset of the amplifier, the input differential transistor pair that receives the input signal is constructed using transistor matching techniques such that the pair is said to be balanced. The transistors of a balanced differential pair are typically replicates of each other in terms of size and as such are designed to mimic each other's electrical characteristics. This also allows the amplifier to respond in the same manner to variations in the input signal that have opposite polarity but the same magnitude.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

FIG. 6B shows a flow diagram of an embodiment of an offset trimming procedure.

DETAILED DESCRIPTION

A variable offset amplifier circuit is described. According to an embodiment, the variable offset amplifier has first and second input differential transistor pairs, each of which has a matched pair of transistors (at least being the same size). According to another embodiment, first and second differential transistor pairs are provided that are intentionally unbalanced. In that case, each pair has first and second output nodes that are "inter-coupled", i.e. the first output node of the first pair is coupled to the second output node of the second pair, and the second output node of the first pair is coupled to the first output node of the second pair. In both cases, variable offset can be advantageously achieved using digitally controlled variable current generators that are coupled to control the respective tail currents of the differential pairs.

Such an amplifier circuit also allows a variable non-zero offset to be introduced, by varying the respective tail currents of the differential pairs. This variable offset capability also allows the inherent offset of the amplifier to be cancelled so that zero offset is achieved. In addition, the non-zero offset may be beneficial in certain applications such as adders; rather than requiring a separate adder circuit, the amplifier can be used to inherently add a value to an input signal by setting a non-zero offset to include the value to be added. The amplifier circuit also permits the polarity of the offset to be changed as a function of changing tail current. This means that there may be a positive or a negative offset that is permissible about a center or nominal offset value. Yet another advantage of the amplifier circuit is that relatively large offset changes may be introduced using relatively small changes in the tail current. This feature helps keep the speed of operation of the amplifier circuit as a whole from varying too much across a wide offset range.

Figure 1:
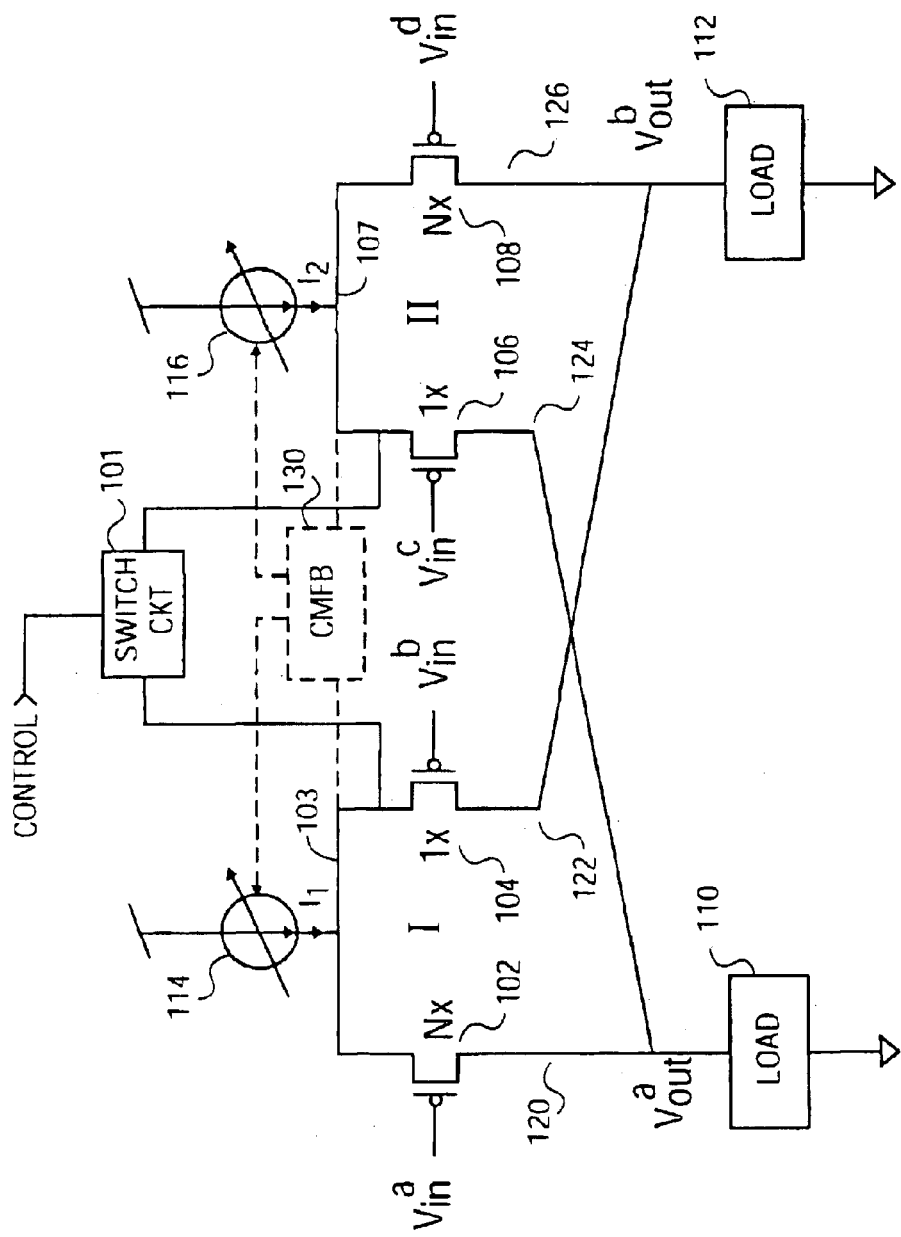
FIG. 1 shows a circuit schematic of an embodiment of a variable offset amplifier circuit.

Referring now to FIG. 1, an embodiment of the amplifier circuit with tail current node equalization is shown as implemented using p-channel metal oxide semiconductor field effect transistors (MOS FETs).

The equalization capability is provided by a switch circuit 101 operated by a control signal. The switch circuit 101 may be, for instance, a single, switching p-channel FET that selectively provides a low impedance path that connects the tail current nodes 103 and 107 directly to each other, as dictated by the control signal. The equalization of the tail current nodes may alternatively be performed by a multiple transistor circuit which creates low impedance paths from the respective tail current nodes 103, 107 to another node which is kept at a fixed voltage. Operation of the circuit with tail current node equalization is described below in connection with a comparator application depicted in FIG. 6.

Referring to FIG. 1, this embodiment includes a first differential transistor pair 102, 104, and a second differential transistor pair 106, 108. Each pair is intentionally unbalanced. For instance, in this embodiment, the unbalanced characteristic is obtained by the transistor 102 being larger than the transistor 104 by a factor N>1 in the width of the transistor channel. Also, transistor 108 has a greater channel width than that of transistor 106, by, in this embodiment, the same factor N. To help keep manufacturing costs low, the length of the transistor channels may be the same across all transistors in the amplifier circuit.

The first and second transistor pairs may be referred to as being inter-coupled to each other because output node 120 of the first pair is coupled to output node 124 of the second pair, while output node 104 of the first pair is coupled to output node 126 of the second pair. Output nodes 120 and 126 are respectively coupled to load devices 110 and 112. These load devices may include passive and/or active circuits, depending on the application of the amplifier circuit. The load devices may alternatively represent a separate output amplification state that provides an output signal at further output nodes of that stage.

The respective tail currents of the differential pairs are controlled by variable current generators 114 and 116 as shown. In this embodiment, variable current generators 114 and 116 are variable current sources that also pass the tail currents of the respective differential pairs. Other types of variable current generators to control the tail currents may alternatively be used. See, e.g., the current sinks in FIG. 2 described below.

Continuing to refer to FIG. 1, the amplifier circuit provides output voltages $V_{out}^b$ and $V_{out}^a$ in response to the input voltages $V_{in}^a$, $V_{in}^b$, $V_{in}^c$, and $V_{in}^d$. In an embodiment of the amplifier circuit, a difference output voltage $V_{out}^b - V_{in}^a$ is generated in response to the difference $V_{in}^a - V_{in}^b$ and $V_{in}^c - V_{in}^d$. The gain of the amplifier circuit may be determined by a variety of factors, including the impedance $RV_{load}$ of the load devices 110 and 112, and the transconductance $g_m$ of each transistor in the first and second differential pairs. The provision of variable non-zero offset by an embodiment of the amplifier circuit in FIG. 1 may be explained using the following example.

Consider the situation where the input voltages are equal, i.e. $V_{in}^a = V_{in}^b = V_{in}^c = V_{in}^d$. Also assume that the tail currents $I_1$ and $I_2$ are equal and the load impedances are equal. In such a configuration, the amplifier circuit provides a nominal offset that will appear at the output as $$V_{out}^b - V_{out}^a = V_{nominal} = \{[N/(N+1)]I_1 + [1/(N+1)]I_2\}R_{load} \quad (1)$$
$$\{[N/(N+1)]I_2 + [1/(N+1)]I_1\}R_{load}$$
$$= 0.$$

Next, keeping the input voltages the same, if $I_1$ is increased and $I_2$ is decreased both by the same amount, namely $I_1 + \Delta I$ and $I_2 - \Delta I$, then $V_{out}^a$ changes to the following:

$$V_{out}^a = \{[N/(N+1)][I_1 + \Delta I] + [1/(N+1)][I_2 - \Delta I]\}R_{load} \quad (2)$$
$$= \{[I + [(N-1)/(N+1)]\Delta I]\}R_{load}$$

Similarly, the new value of $V_{out}^b$ is given by:

$$V_{out}^b = \{[N/(N+1)][I_2 - \Delta I] + [1/(N+1)][I_1 + \Delta I]\}R_{load} \quad (3)$$
$$= \{[I - [(N-1)/(N+1)]\Delta I]\}R_{load}$$

Finally, the difference output voltage $V_{out}^b - V_{out}^a$ is given by:

$$V_{out}^b - V_{out}^a = -[2(N-1)/(N+1)]\Delta I \, R_{load} \quad (4)$$

Thus, increasing $I_1$ and decreasing $I_2$ resulted in a decrease in the difference output voltage as given in the expression above. This decrease is the offset forced by the change in the tail currents. Now, if the tail currents are changed in the reverse direction, that is if $I_1$ is decreased and $I_2$ is increased by the same amount, then following an analysis similar to that above gives the following expression:

$$V_{out}^b - V_{out}^a = [2(N-1)/(N+1)]\Delta I \, R_{load} \quad (5)$$

which is an offset in the output voltage that is opposite in polarity to that given by equation (4). Thus, this example illustrates how opposite polarity offsets may be obtained in proportion to a differential change in the tail currents.

It should be noted that although in the example above the change in tail current was exactly differential in that one tail current was increased by exactly the same amount as the other tail current was decreased, the amplifier circuit may still be useful if the tail currents are changed in unbalanced ways. Also, unequal load impedances may alternatively be provided to force a non-zero nominal offset.

Continuing to refer to FIG. 1, to improve the common mode rejection of the amplifier circuit, a common mode feedback circuit (CMFB) 130 may be coupled to adjust the variable current generators 114, 116 in response to voltages of the first and second differential pairs. In the embodiment shown, the CMFB 130 detects the voltage at the output of the variable current generators 114 and 116 and in response adjusts the tail currents of the differential pairs by adjusting the variable current generators 114, 116. The CMFB 130 does not add any significant capacitance to the inputs of the differential pairs, making the CMFB 130 compatible with applications that require low input capacitance.

Figure 2:
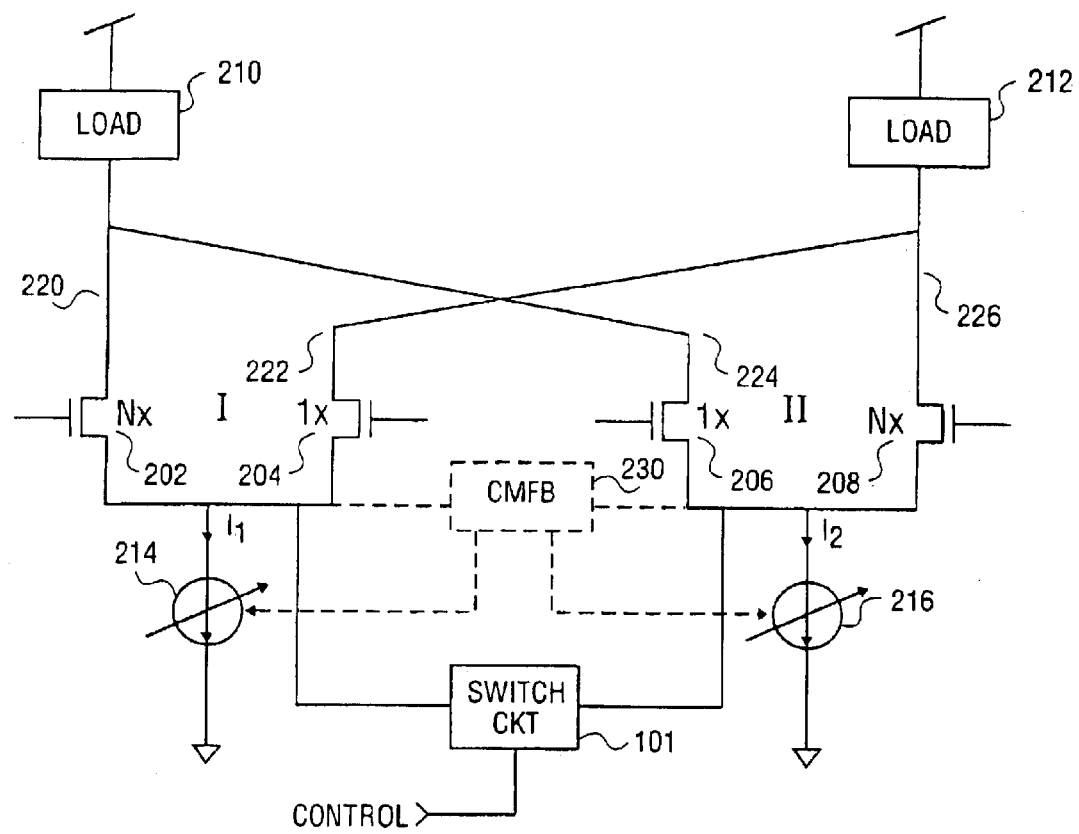
FIG. 2 depicts a circuit schematic of another embodiment of the variable offset amplifier circuit.

Referring now to FIG. 2, what's shown is a circuit schematic of another embodiment of the variable offset amplifier, this time using n-channel MOS FETs 202, 204 for the first differential pair and n-channel MOS FETs 206, 208 for the second differential pair. The variable current generators in this embodiment are current sinks 214 and 216 which control the tail currents of the differential amplifiers, respectively. The output nodes 220 and 224 are coupled to a load 210 which in turn is coupled to a power supply node, whereas output nodes 222 and 226 are coupled to a load 212 which is also coupled to the power supply node. Thus, in contrast to the embodiment of FIG. 1, the amplifier circuit in FIG. 2 has its load devices 210, 212 referenced to a power supply node rather than to a power return (e.g. ground) node. Despite this difference, the same ability to adjust the offset is present and the example used to explain the operation of the embodiment of FIG. 1 also applies albeit with a slight difference in nomenclature to the n-channel embodiment in FIG. 2. In addition, a CFMB 230 may also be provided for the n-channel embodiment in FIG. 2, to further improve the common mode rejection of this amplifier circuit. Tail current node equalization may be obtained in this embodiment via a single, switching n-channel FET (not shown) coupled to provide a low impedance path directly between the tail current nodes under a gate control signal.

Figure 2B:
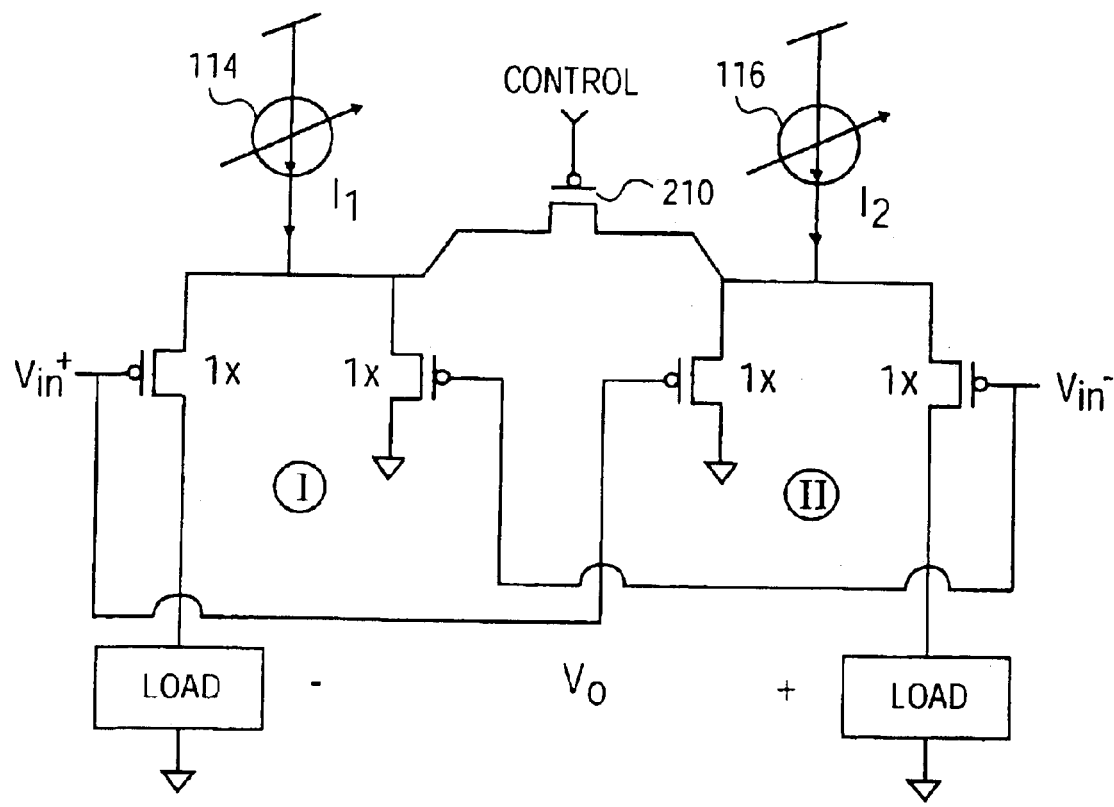
FIG. 2B illustrates a circuit schematic of a variable offset amplifier circuit that uses matched differential pairs.

In FIG. 2B, a circuit schematic of a variable offset amplifier circuit that uses matched differential pairs I and II is shown. This embodiment is designed to accept a single, differential input signal $V_n$, and in response provide a differential output signal $V_o$ at the output nodes indicated. Note that each differential amplifier I, II in this case is configured to have a single-ended output such that together they provide the differential output signal $V_o$. Variable offset is obtained in this embodiment by setting the tail currents $I_1$ and $I_2$ to different values, using variable current generators 114 and 116. Tail current node equalization is provided by a single p-channel transistor 210 whose gate receives the control signal.

Figure 3:
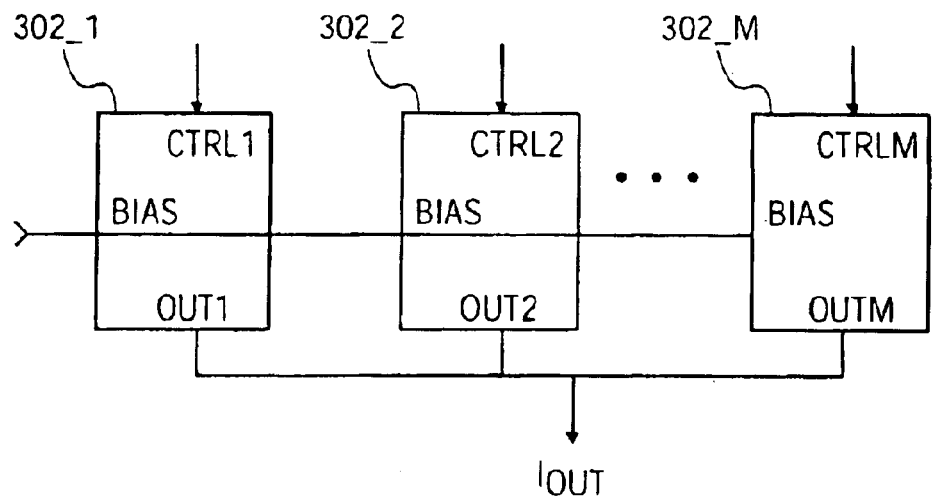
FIG. 3 illustrates a circuit schematic of an embodiment of a digitally controllable current source.

Referring now to FIG. 3, this figure depicts a circuit schematic of an embodiment of a digitally controllable current source that can be used in place of the variable current generator 114 or 116. This current source has a number of digitally variable current cells 302_1, 302_2 ... 302_M that are coupled in parallel to provide their individual currents which are summed to yield $I_{out}$. This output current $I_{out}$ may be the tail current of a differential transistor pair. Each individual cell current may be adjusted by varying a bias level in each cell in response to an input signal. The individual cell current may be turned on or off in response to a signal at a control input CTL as shown. This control signal may be digital in nature, that is have one of two stable states corresponding to two levels of current at each individual cell's output. The total current may thus be adjusted by setting a digital value at the control inputs of the individual cells 302.

It should be noted that the output currents provided by the individual cells 302 may be unbalanced. For instance, some of the cells may provide larger currents (for coarse granularity control of the output current) while others may provide smaller currents (for fine granularity control of the output current $I_{out}$.) Use of such digitally controllable current sources allows the offset of the amplifier circuit to be trimmed digitally, by selecting the desired offset according to a multi bit digital value.

Figure 4:
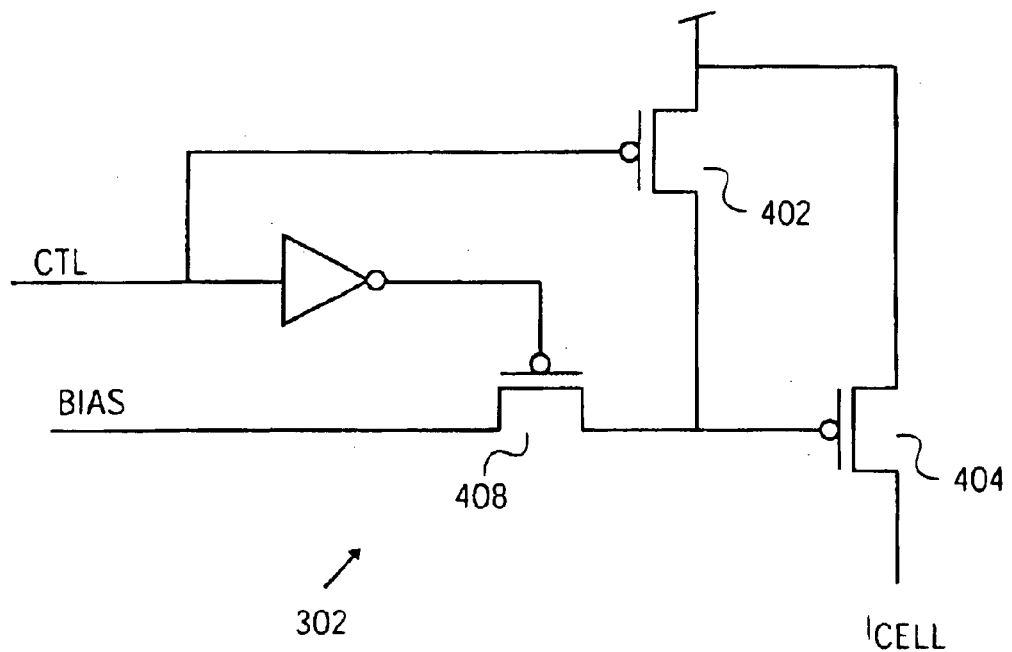
FIG. 4 shows a circuit schematic of a digitally controllable current source cell.

FIG. 4 shows a circuit schematic of an embodiment of a digitally controllable current source cell 302. When the input signal at CTL is at a relatively high voltage, such that the p-channel transistor 402 is cut off, the output drive p-channel transistor 404 is biased according to an input bias signal at BIAS via p-channel transistor 408. In the other state, i.e., when the input signal at CTL drops to a relatively low voltage such that p-channel transistor 402 has its channel inverted, the gate of the p-channel transistor 404 is pulled to a relatively high voltage that is sufficient to, in this embodiment, place the transistor 404 in cutoff. Thus, two different levels of cell current $I_{cell}$, e.g. "on" and "off", are obtained in response to the input control signal at CTL. As mentioned in the previous paragraph, the various cells may be designed to provide different levels of "on" currents so that some may be used for fine granularity control of the total current $I_{out}$ (see FIG. 3) while others may be used for relatively coarse granularity control of this output current. Referring back to FIG. 4, the varying levels of "on" currents may be achieved by sizing the transistors 408 and 404 as known to those of ordinary skill in the art.

Figure 5:
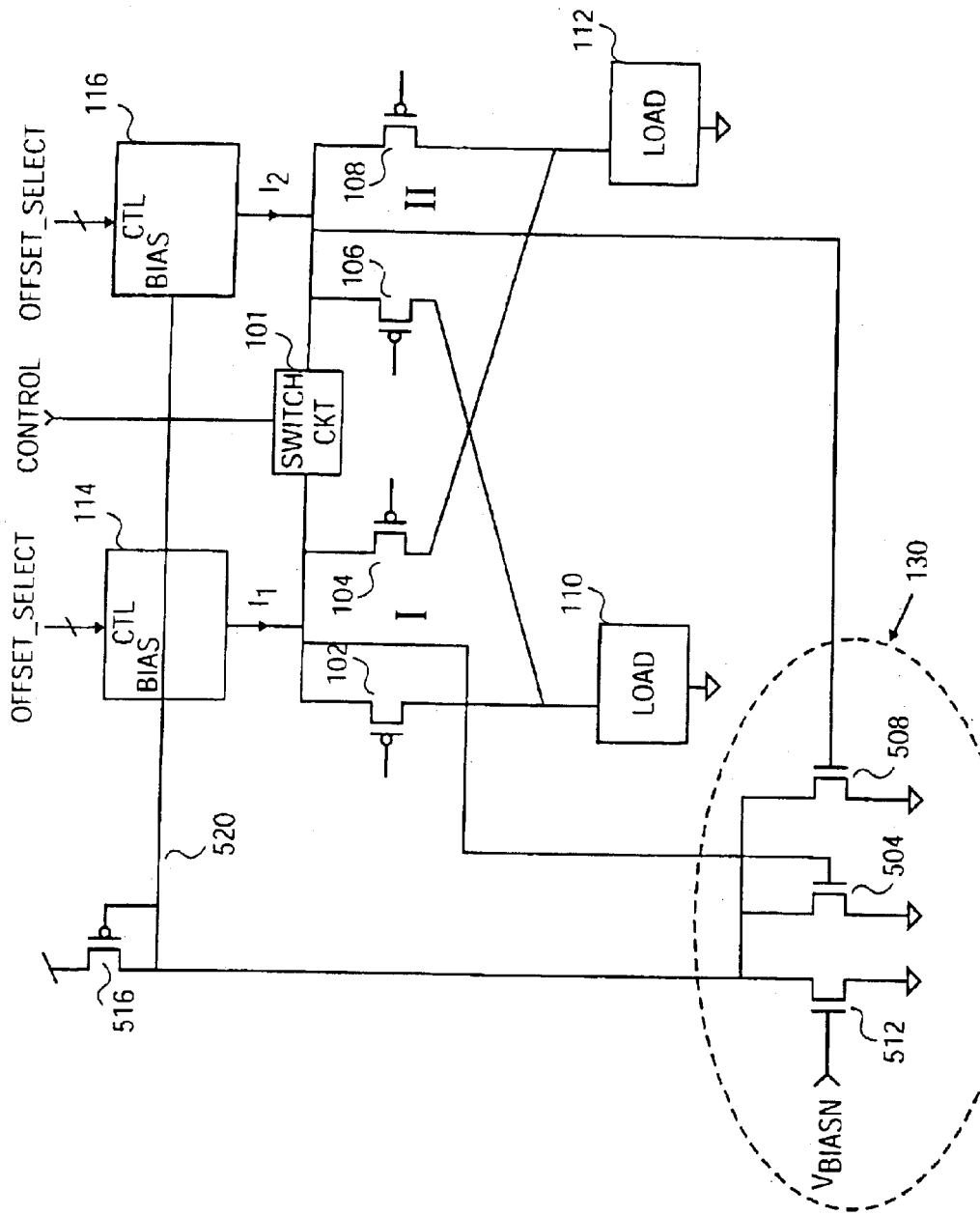
FIG. 5 depicts a circuit schematic of an embodiment of the variable offset amplifier that also includes an embodiment of a common mode feedback circuit.

Turning now to FIG. 5, this figure depicts a circuit schematic of an embodiment of the CMFB 130 used to improve common mode rejection, in an embodiment of the amplifier circuit. This embodiment of the amplifier circuit is similar to the p-channel embodiment shown in FIG. 1 that includes mismatched p-channel transistors 102, 104 for the first differential pair and 106, 108 for the second differential pair. Variable current generators 114 and 116 are coupled to source tail currents into a common source node for each pair as shown.

The voltages at two common source nodes are provided to separate n-channel transistors 504 and 508. If the two common source node voltages are equal, then the transistors 504 and 508, which in this embodiment are assumed to be matched, will present the same impedance to a bias circuit that includes the n-channel transistor 512 coupled in series with a diode connected p-channel transistor 516. A predetermined bias voltage appears at the node 520 which controls both bias levels of the two variable current generators 114, 116. The CMFB 130 operates as follows. Any differential variation in the common source nodes of the differential pairs should not cause a significant change in the total impedance between the node 520 and power supply return (ground), because of the way transistors 504 and 508 are connected to the same output node 520. However, if there is a common mode voltage change such that the voltages at both common source nodes of the differential pairs either increase or decrease simultaneously, then the impedance presented to node 520 will change, thereby causing the voltage at that node 520 to also change in a predetermined manner. In the embodiment shown in FIG. 5, if the voltages at the common source nodes of the differential pairs were to increase simultaneously, then the voltage at node 520 decreases in response, which in turn decreases the bias level and therefore the output current of each variable current generator 114, 116. On the other hand, if the common source node voltages of the differential pairs were to decrease simultaneously, then the voltage at the node 520 would increase in response, thereby increasing the tail currents $I_1$ and $I_2$. Such a feedback mechanism helps improve the common mode rejection of the amplifier circuit when it is used as a difference amplifier.

Figure 6:
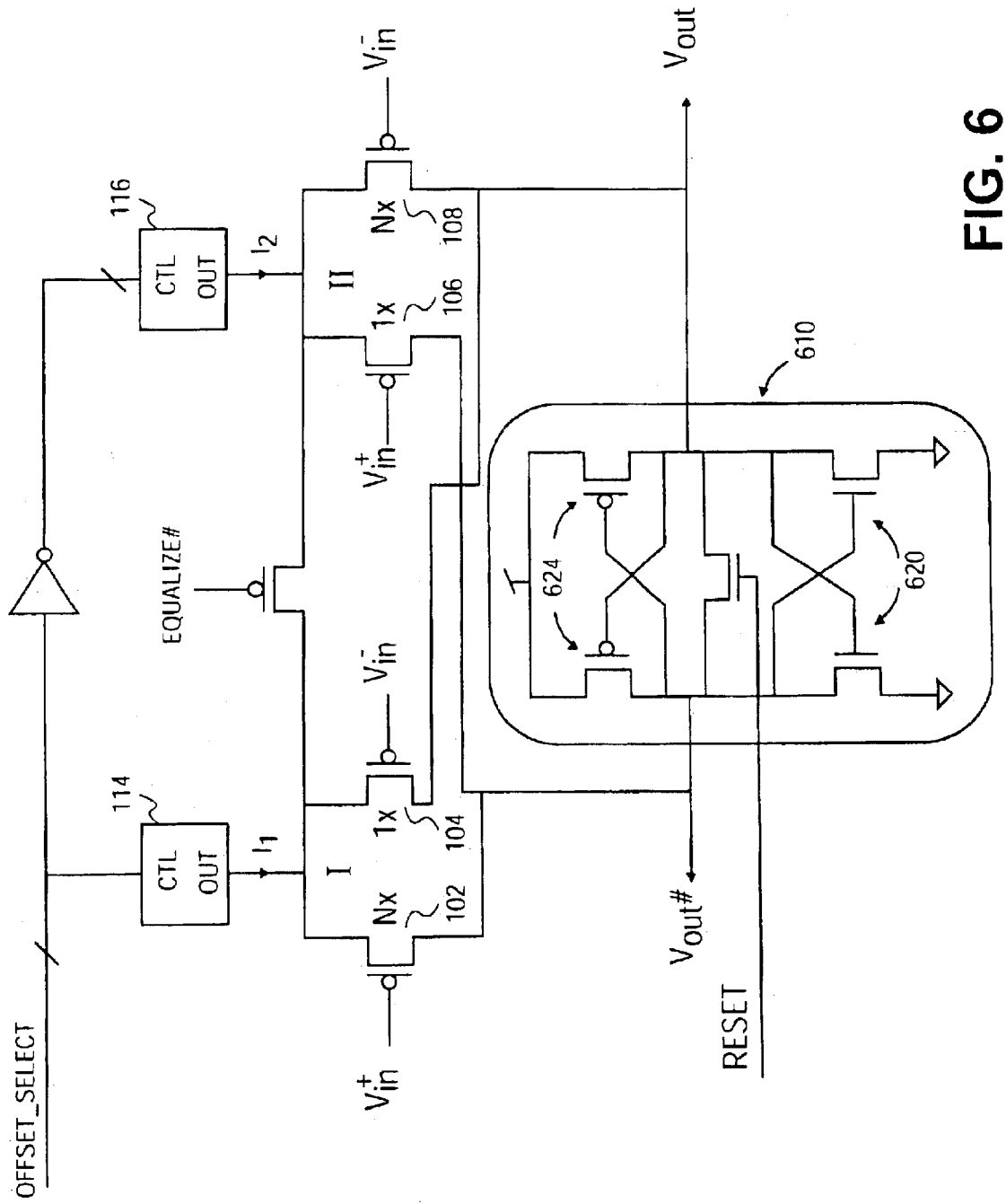
FIG. 6 illustrates a circuit schematic of an embodiment of a digitally controllable variable offset comparator circuit.

Turning now to FIG. 6, this figure illustrates a circuit schematic of an embodiment of a digitally controllable variable offset comparator circuit. The comparator circuit includes an amplifier circuit substantially as shown in the schematic of FIG. 1, including the first and second differential pairs which are defined by transistors 102, 104 and 106, 108, respectively. An alternative here would be to use the amplifier circuit of FIG. 2B. The variable current generators 114 and 116 are also coupled to control the tail currents $I_1$ and $I_2$ to the respective differential pairs. These current generators 114, 116 are controlled by a digital value that is received on multiple, offset select lines as shown. In this embodiment, each digital value of the offset corresponds to two oppositely varying tail currents $I_1$, and $I_2$ that are equidistant from a nominal tail current. This configuration is similar to the example given above in connection with FIG. 1 which helped explain the availability of opposite polarity offset using the amplifier circuit.

A single ended output voltage for this comparator may be available as either $V_{out}$ or $V_{out}\#$. To drive these output signals into one of two possible stable states, a regenerative load circuit 610 is provided as shown. After being reset by an input signal, this regenerative load circuit 610 will quickly amplify any difference between $V_{out}$ and $V_{out}\#$, where such amplification occurs at a relatively high gain due to the cross coupled n-channel pair 620 and p-channel pair 624, thereby ensuring that the output signals $V_{out}$ and $V_{out}\#$ only assume one of two possible stable states. Thus, if $V_{in}{}^+$ is greater than $V_{in}{}^-$ by at least the amount of offset that has been selected (as referred back to the input of the differential pairs), then the regenerative latch circuit 610 forcefully drives $V_{out}$ to a low voltage level and simultaneously drives $V_{out}\#$ to a high voltage level. Other types of regenerative latch circuits may be used to provide the digital type output signal typically associated with a sense amplifier or a comparator application.

The variable offset comparator shown in FIG. 6 may behave as a sense amplifier which detects small differences between two analog signals $V_{in}{}^+$ and $V_{in}{}^-$. In this embodiment, a pair of differential signals are sensed, where the first differential signal is applied to the first differential pair 102, 104, while an inverted version of the differential signal is applied to the second differential pair 108, 106. This signal definition assumes that $V_{in}{}^+$ is fed to the gate of the larger transistor 102 as well as the gate of the smaller transistor 106. Similarly, $V_{in}{}^-$ is fed to the gate of the smaller transistor 104 and to the gate of the larger transistor 108.

Turning now to FIG. 6B, a flow diagram for an offset trimming process is depicted. In operation 660, the comparator inputs are shorted to each other and, if necessary, to some reasonable voltage. The offset adjustment is then swept from the maximum negative to positive offset values (operation 664). Assuming the gain of the comparator is very large, the output of the comparator will change from low to high when the offset adjustment value is at the lowest offset setting (operation 668). At this setting, the offset of the comparator may be less than 1 least significant bit (LSB) of offset resolution. Note that changing the offset of the comparator may be viewed as changing the reference level to which a differential input signal $V_{in}^+ - V_{in}^-$, as connected in the embodiment of FIG. 6, will be compared by the comparator. Thus, the reference level of the comparator may be set by the offset adjustment.

Figure 7:
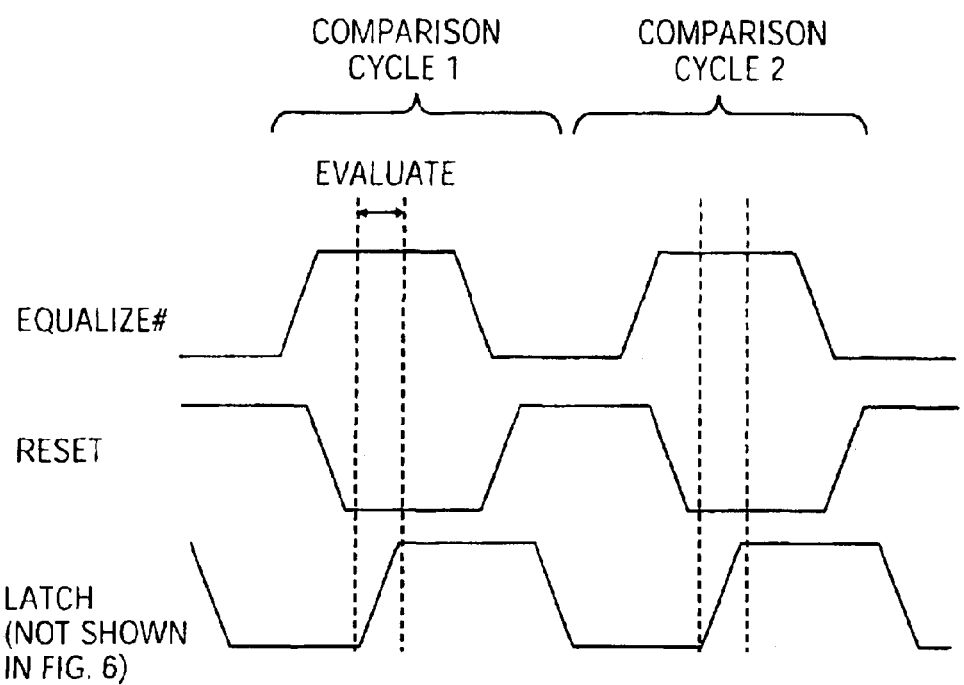
FIG. 7 illustrates a waveform timing diagram of an embodiment of a process for operating the variable offset amplifier circuit with tail current node equalization.

In FIG. 7, a waveform timing diagram of a process for operating the variable offset amplifier circuit with tail current node equalization is shown. In particular, this process refers to a comparator application such as depicted in FIG. 6 in which the output of the amplifier is a bistable output of the regenerative load circuit 610. In this embodiment, the control signal that is used to control the switch circuit 101 (in this case a single p-channel FET) is a digital signal applied to the gate of the FET and that has at least two stable states. The control signal also has a precise timing relationship with respect to the reset signal, another digital signal that is applied to equalize the output nodes of the regenerative load circuit 610. This control signal, labeled equalize#, is depicted by a separate waveform shown in FIG. 7. FIG. 7 also shows a waveform for the reset signal as well as a waveform for a latch signal. The latch signal is used to evaluate the first and second output nodes, by latching on, in this example, the rising edge, a discrete voltage state of the first and second output nodes. The structure for such a function is not shown in FIG. 6 as it is easily understood by one of ordinary skill in the art to include, for example, a flip flop.

The waveforms in FIG. 7 are interpreted to show that equalize# is used to equalize voltages of the tail current nodes, while at the same time the reset signal is asserted, the latter causing the output nodes to be equalized. The reset signal is deasserted, just after equalize# is deasserted. This causes the comparator offset to be more predictable when the input differential pairs I, II are to detect the information that is present at their inputs. This detection is exhibited at the output nodes whose voltages will be in a state that is then evaluated in the time interval indicated in FIG. 7, by the rising edge of the latch signal. This process of resetting, equalization, and latching can be repeated, based on the timing of a single clock signal (not shown) to repeatedly and accurately perform comparisons or sensing of an input signal.

The waveforms of FIG. 7 also illustrate some of the advantages of tail current node equalization, as applied to for instance a variable offset comparator application. Referring to FIGS. 1, 2, and 2B, consider that if a large transient were to appear on the inputs of the differential pairs I, II just before evaluation of the output nodes, such transient might inject noise (and in particular, differential noise) into the tail current nodes. An example of such a transient would be one caused the output of a switched capacitor, discrete arithmetic circuit. In such a case, the tail current values $I_1$, $I_2$ may change, due to the finite output impedance of the variable current generators 114, 116. This differential current error effectively changes the input offset of the amplifier and comparator, as the offset is controlled by the tail currents $I_1$, $I_2$. Although the tail current nodes will settle, unassisted, to their predetermined, quiescent value in time, the nodes may move towards their quiescent voltage values at substantially different rates. This may also require a significant period of time, (e.g. 20–30 pico seconds, where the period of the waveforms in FIG. 7 is about 200 pico seconds) thereby lowering the frequency at which the comparator can be used to repeatedly make comparisons. Accordingly, a solution to this problem may be to equalize the tail current nodes, as described above, without waiting the length of time needed for the tail current nodes to settle unassisted, only until the earliest point in time at which the correct information represented by the input signal can be expected to be evaluated at the output nodes.

Another advantage of tail current node equalization is particularly apparent in comparator applications with a complementary MOS type latch in the output stage. Such an output stage can yield a full swing (nearly rail to rail) output voltage for the comparator. However, this full swing can change the tail current nodes from their quiescent voltage values, thereby affecting the offset (and hence decreasing the sensitivity) of the comparator for the next comparison cycle (see FIG. 7). Tail current equalization "dissipates" this affect, without having to wait a relatively longer period of time for the tail current nodes to settle unassisted.

Figure 8:
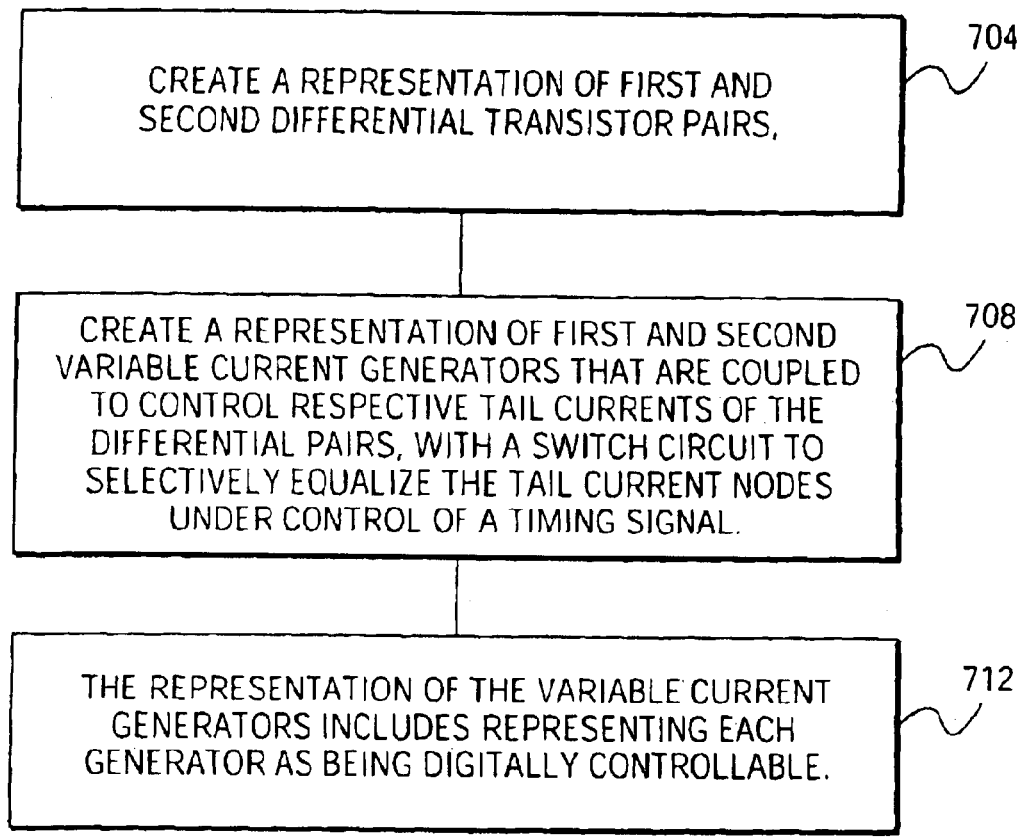
FIG. 8 shows a flow diagram of an embodiment of a process for designing the variable offset amplifier circuit.

The various embodiments of the amplifier circuit described above may be designed using conventional computer aided design/electronic design automation tools. FIG. 8 depicts a flow diagram of an embodiment of a computer-implemented method for designing the amplifier circuit. The method involves the creation of a representation of the differential transistor pairs where each pair is either intentionally unbalanced as in FIGS. 1 and 2, or balanced as in FIG. 2B (Operation 704). The size of the transistors that constitute an unbalanced pair may be selected according to the width of the channel of each transistor, while keeping the length of the channels the same. Other techniques for sizing the transistors may alternatively be used.

The method also includes creating a representation of first and second variable current generators that are coupled to control respective tail currents of the first and second differential pairs (Operation 708). This representation of the variable current generators may include representing each generator as being digitally controllable as, for instance, shown in FIG. 3 (operation 712).

As mentioned above, there are various different scenarios for applying input signals to the amplifier circuit. For instance, a differential input signal may be applied to the larger and smaller transistors of the first pair, while an inverted version of the input signal may be applied to the larger and smaller transistors of the second pair. In a comparator embodiment, a magnitude of this differential input signal may be compared to a reference value that has been defined by a digital offset selection value. In a sense amplifier embodiment, this reference value may be set to a very small value. A representation of these input signals may be created using a computer-implemented method according to various well known techniques.

In addition, an output of the amplifier circuit may be defined in different ways as well. For instance, a differential output voltage may be defined as the difference between $V_{out}^b$ and $V_{out}^a$ (see FIG. 1). Other types of outputs, such as the single ended output as defined for the sense amplifier/comparator application of FIG. 6, may also be represented in the computer-implemented method. In general, the representations of all the embodiments described above may be created using computer aided design/electronic design automation tools that are well know to those of ordinary skill in the art.

Figure 9:
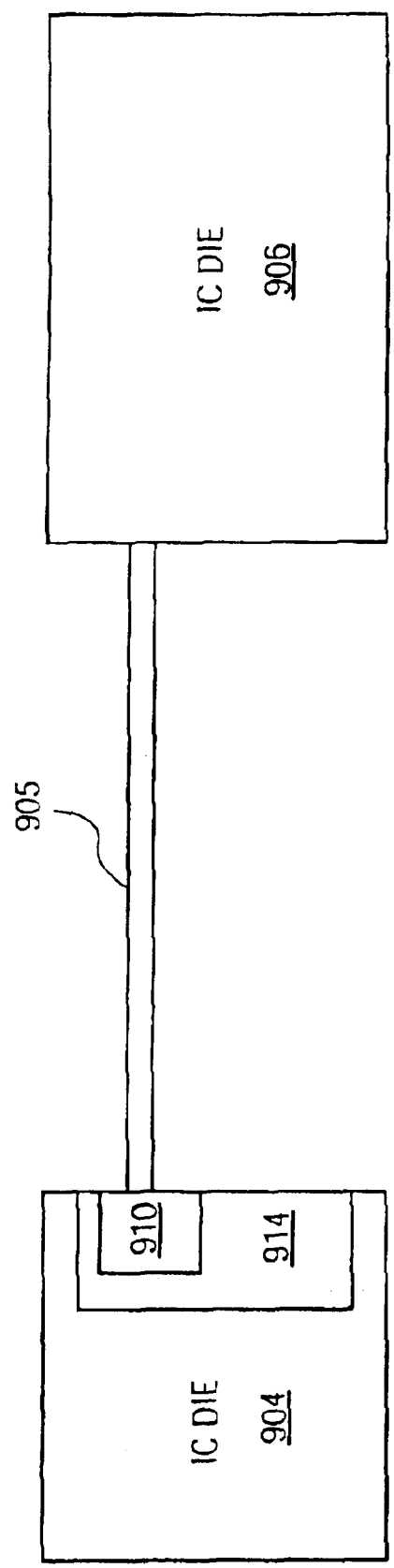
FIG. 9 depicts a high speed data link in which a variable offset comparator is used in the receiver portion.

A particular system application of the variable offset comparator with tail current node equalization is illustrated in FIG. 9. That figure shows a digital high speed data link involving two integrated circuit dies 904, 906 that are connected by a bus 905. The bus 905 is designed to carry a differential signal (data, address, or control) between the dies 904, 906. In the receiver portion 910 of the bus interface 914 (either in die 904 or in die 906), this differential signal is forwarded to the two input nodes of an on-chip variable offset comparator (such as the one depicted in FIG. 6). The comparator is controlled (via the equalize# and reset signals) so that data symbols in the differential signal are detected as latched voltage states of the comparator output nodes.

To summarize, various embodiments of a variable offset circuit with digitally controlled variable current generators, and a process for designing such a circuit have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the particular circuit schematic shown in FIG. 4 for the digitally controllable current cell is just an example of a wide range of different designs that may be used to provide digital control of cell current. The specification and drawings are, accordingly, to be regarded in an illustrative rather than a restrictive sense.

What is claimed is:

1. An amplifier circuit comprising:
    first and second differential transistor pairs, each pair having first and second output nodes, the first output node of the first pair being coupled to the second output node of the second pair, the second output node of the first pair being coupled to the first output node of the second pair; and
    first and second digitally controllable variable current generators, each having a plurality of cells all coupled in parallel to each other to provide the respective tail currents of the first arid second differential pairs, each cell having a) a first input to receive a bias signal to set an output current, and b) a second input to receive an on/off control signal to turn on and turn off the output current.

2. The amplifier circuit of claim 1 wherein for each differential transistor pair, the first output node is coupled to be driven by a larger transistor of the pair and the second output node is coupled to be driven by a smaller transistor of the pair.

3. The amplifier circuit of claim 2 wherein the first differential transistor pair is to receive an input signal at the larger and smaller transistors of that pair, and the second differential transistor pair is to receive an inverted version of the input signal at the larger and smaller transistors of that pair.

4. The amplifier circuit of claim 1 wherein the first differential transistor pair is to receive an input signal and the second differential transistor pair is to receive an inverted version of the input signal.

5. The amplifier circuit of claim 4 further comprising:
    a regenerative load circuit coupled to the first and second output nodes.

6. The amplifier circuit of claim 1 further comprising:
    a common mode feedback circuit coupled to adjust the first and second variable current generators so as to improve the common mode rejection of the amplifier circuit in response to voltages of the first and second differential pairs.

7. A computer-implemented method for designing an amplifier circuit, comprising:
    creating a representation of first and second differential transistor pairs each being intentionally unbalanced, each pair having first and second output nodes, the first output node of the first pair being coupled to the second output node of the second pair, the second output node of the first pair being coupled to the first output node of the second pair, a latch circuit coupled to the first and second output nodes; and
    creating a representation of first and second digitally controllable variable current generators each having a plurality of cells all coupled in parallel to each other to provide the respective tail currents of the first and second differential pairs, each cell having a) a first input to receive a bias signal to set an output current, and b) a second input to receive an on/off control signal to turn on and turn off the output current.

8. The method of claim 7 wherein the representing of each differential transistor pair includes representing the first output node as being coupled to be driven by a larger transistor of the pair and the second output node as being coupled to be driven by a smaller transistor of the pair.

9. The method of claim 8 further comprising:
    creating a representation of an input signal being applied to the larger and smaller transistors of the first differential transistor pair; and
    creating a representation of an inverted version of the input signal being applied to the larger and smaller transistors of the second differential transistor pair.

10. The method of claim 7 further comprising:
    creating a representation of an input signal being applied to the first differential transistor pair; and
    creating a representation of an inverted version of the input signal being applied to the second differential transistor pair.

11. The method of claim 10 further comprising creating a representation of equalizing voltages of tail current nodes of the first and second differential pairs, and then releasing the tail current nodes while a differential signal is being applied to input nodes of the first and second differential pairs, and then evaluating the first and second output nodes.

12. The method of claim 7 further comprising:
    creating a representation of a common mode feedback circuit as being coupled to adjust the first and second variable current generators so as to improve the common mode rejection of the amplifier circuit in response to voltages of the first and second differential pairs.

* * * * *